(12) United States Patent
Machida et al.

(10) Patent No.: US 9,533,502 B2
(45) Date of Patent: Jan. 3, 2017

(54) ELECTRO-MECHANICAL TRANSDUCER ELEMENT, LIQUID DROPLET EJECTING HEAD, IMAGE FORMING APPARATUS, AND ELECTRO-MECHANICAL TRANSDUCER ELEMENT MANUFACTURING METHOD

(71) Applicants: Osamu Machida, Kanagawa (JP); Akira Shimofuku, Kanagawa (JP); Ryo Tashiro, Kanagawa (JP); Atsushi Takeuchi, Kanagawa (JP)

(72) Inventors: Osamu Machida, Kanagawa (JP); Akira Shimofuku, Kanagawa (JP); Ryo Tashiro, Kanagawa (JP); Atsushi Takeuchi, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 530 days.

(21) Appl. No.: 13/965,900

(22) Filed: Aug. 13, 2013

(65) Prior Publication Data
US 2014/0049582 A1 Feb. 20, 2014

(30) Foreign Application Priority Data

Aug. 14, 2012 (JP) .................. 2012-179804
Feb. 19, 2013 (JP) .................. 2013-030193
May 10, 2013 (JP) .................. 2013-099983

(51) Int. Cl.
| | | |
|---|---|---|
| H01L 41/33 | (2013.01) | |
| B41J 2/14 | (2006.01) | |
| H01L 41/08 | (2006.01) | |
| H01L 41/332 | (2013.01) | |
| H01L 41/09 | (2006.01) | |
| H01L 41/187 | (2006.01) | |

(Continued)

(52) U.S. Cl.
CPC ........ *B41J 2/14233* (2013.01); *H01L 41/0805* (2013.01); *H01L 41/0973* (2013.01); *H01L 41/1876* (2013.01); *H01L 41/318* (2013.01); *H01L 41/33* (2013.01); *H01L 41/331* (2013.01); *H01L 41/332* (2013.01)

(58) Field of Classification Search
CPC ............. H01L 41/1876; H01L 41/0805; H01L 41/331; H01L 41/318; H01L 41/0973; H01L 41/332
USPC ....... 310/351, 330, 367, 365, 328, 331, 348; 29/25.35; 347/68
IPC ...................................................... H01L 41/08
See application file for complete search history.

(56) References Cited

U.S. PATENT DOCUMENTS

| | | |
|---|---|---|
| 5,530,465 A | 6/1996 | Hasegawa et al. |
| 6,505,919 B1 * | 1/2003 | Mizutani .............. B41J 2/14233 310/332 |
| 6,523,943 B1 | 2/2003 | Fukui |

(Continued)

FOREIGN PATENT DOCUMENTS

| | | |
|---|---|---|
| JP | H08-164606 | 6/1996 |
| JP | 3019845 | 3/2000 |

(Continued)

*Primary Examiner* — Thomas Dougherty
*Assistant Examiner* — Karen B Addison
(74) *Attorney, Agent, or Firm* — Cooper & Dunham LLP

(57) ABSTRACT

An electro-mechanical transducer element is disclosed. The electro-mechanical transducer element includes a first electrode formed on a substrate; an electro-mechanical transducer film formed on at least a part of the first electrode; and a second electrode formed on at least a part of the electro-mechanical transducer film. In at least one cross section of the electro-mechanical transducer film, a film thickness distribution shape is convex to the second electrode side.

17 Claims, 15 Drawing Sheets

(51) Int. Cl.
*H01L 41/318* (2013.01)
*H01L 41/331* (2013.01)

(56) References Cited

U.S. PATENT DOCUMENTS

| | | | |
|---|---|---|---|
| 6,869,170 B2 | 3/2005 | Shimada et al. | |
| 7,101,026 B2 | 9/2006 | Shimada et al. | |
| 7,221,075 B2 | 5/2007 | Nanataki et al. | |
| 7,364,275 B2 * | 4/2008 | Lim | B41J 2/14233 310/324 |
| 7,387,372 B2 * | 6/2008 | Ishikawa | B41J 2/14233 347/68 |
| 7,466,067 B2 | 12/2008 | Sugahara | |
| 7,537,320 B2 * | 5/2009 | Sugahara | B41J 2/14233 347/70 |
| 8,960,866 B2 * | 2/2015 | Machida | B41J 2/14233 347/68 |
| 2005/0167712 A1 | 8/2005 | Kijima et al. | |
| 2005/0236654 A1 | 10/2005 | Kijima et al. | |
| 2007/0096180 A1 | 5/2007 | Yamakawa et al. | |
| 2010/0079558 A1 | 4/2010 | Shimada | |
| 2010/0132176 A1 * | 6/2010 | Lee | B41J 2/14233 29/25.35 |
| 2011/0090289 A1 * | 4/2011 | Mizukami | B41J 2/161 347/68 |
| 2012/0038712 A1 | 2/2012 | Akiyama et al. | |
| 2012/0235762 A1 | 9/2012 | Ii et al. | |
| 2012/0236081 A1 | 9/2012 | Nakayama et al. | |

FOREIGN PATENT DOCUMENTS

| | | |
|---|---|---|
| JP | 2001-196652 | 7/2001 |
| JP | 3379106 | 2/2003 |
| JP | 3379538 | 2/2003 |
| JP | 2003-309298 | 10/2003 |
| JP | 3473608 | 12/2003 |
| JP | 3636301 | 4/2005 |
| JP | 3725390 | 12/2005 |
| JP | 2006-156987 | 6/2006 |
| JP | 2006-282456 | 10/2006 |
| JP | 2007-088147 | 4/2007 |
| JP | 2007-281286 | 10/2007 |
| JP | 2008-147582 | 6/2008 |
| JP | 4117504 | 7/2008 |
| JP | 4171908 | 10/2008 |
| JP | 2009-158538 | 7/2009 |
| JP | 2009-283950 | 12/2009 |
| JP | 2010-100035 | 5/2010 |
| JP | 2010-228276 | 10/2010 |
| JP | 2011-009726 | 1/2011 |
| JP | 2011-018836 | 1/2011 |
| JP | 2011-091138 | 5/2011 |
| JP | 2011-108996 | 6/2011 |
| JP | 4811556 | 11/2011 |
| JP | 2012-015388 | 1/2012 |
| JP | 4963159 | 6/2012 |
| JP | 2012-192541 | 10/2012 |
| JP | 2012-199602 | 10/2012 |

* cited by examiner

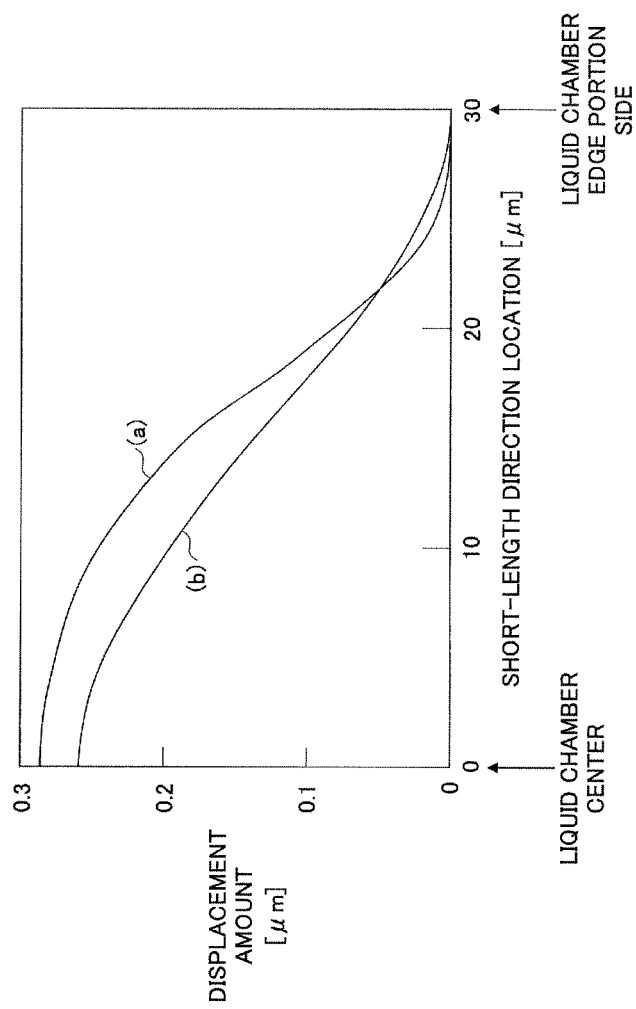

ELECTRO-MECHANICAL TRANSDUCER ELEMENT, LIQUID DROPLET EJECTING HEAD, IMAGE FORMING APPARATUS, AND ELECTRO-MECHANICAL TRANSDUCER ELEMENT MANUFACTURING METHOD

TECHNICAL FIELD

The present invention relates to electro-mechanical transducer elements, liquid droplet ejecting heads, image forming apparatuses, and electro-mechanical transducer element manufacturing methods.

BACKGROUND ART

Apparatuses such as a vibration sensor, a piezoelectric speaker, various drive apparatuses, etc., include an electro-mechanical transducer element on which an electro-mechanical transducer film is laminated. In the drive apparatuses, a liquid ejecting head of an inkjet recording apparatus, for example, includes a nozzle which ejects ink droplets, a liquid chamber to which the above-mentioned nozzle is communicatively connected, and the electro-mechanical transducer element such as a piezoelectric element, etc., wherein ink within the liquid chamber is pressurized to thereby cause the ink droplets to be ejected from the nozzle.

In recent years, with an aim to obtain more efficient vibration, and deformation and displacement, various technical proposals are being made on electro-mechanical transducer elements which include an electro-mechanical transducer film. (See Patent documents 1-6):

PATENT DOCUMENTS

Patent document 1: JP4117504B
Patent Document 2: JP2008-147682A
Patent document 3: JP3725390B
Patent document 4: JP3636301B
Patent document 5: JP3019845B
Patent document 6: JP2011-018836A

DISCLOSURE OF THE INVENTION

However, in the electro-mechanical transducer elements disclosed in Patent documents 1 to 6, etc., the electro-mechanical transducer film is uniformly formed on an electrode. Therefore, there is a problem that deformation and displacement of the electro-mechanical transducer element is not uniform within a liquid chamber.

In light of the circumstances and problems described above, an object of the present invention is to provide an electro-mechanical transducer element from which an efficient deformation and displacement is obtained.

According to an embodiment of the present invention, an electro-mechanical transducer element is provided, including a first electrode formed on a substrate; an electro-mechanical transducer film formed on at least a part of the first electrode; and a second electrode formed on at least a part of the electro-mechanical transducer film, wherein, in at least one cross section of the electro-mechanical transducer film, a film thickness distribution shape is convex to the second electrode side.

The present invention makes it possible to provide an electro-mechanical transducer element from which an efficient deformation and displacement is obtained.

BRIEF DESCRIPTION OF THE DRAWINGS

Other objects, features, and advantages of the present invention will become more apparent from the following detailed descriptions when read in conjunction with the accompanying drawings, in which:

FIG. 6 is a diagram illustrating one example of results of measuring a displacement amount at a location in a short-length direction in the electro-mechanical transducer element according to the first embodiment;

BEST MODE FOR CARRYING OUT THE INVENTION

Figure 1:
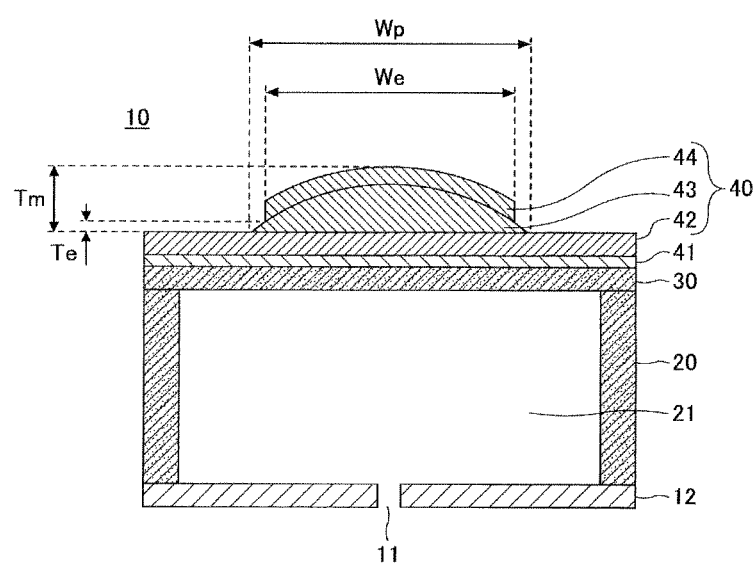
FIG. 1 is a schematic diagram illustrating one example of a structure of a liquid droplet ejecting head according to the present embodiment.

Below embodiments of the present invention are described in detail with reference to drawings. For elements such as members, components, etc., having the same function, shape, etc., over embodiments, etc., the same letters are affixed as long as they are distinguishable, so that repeated explanations are omitted. What is described in the embodiments is merely one form, so that the scope of the present invention is not limited thereto.

Moreover, in the present embodiments, an "image forming apparatus" of a liquid ejecting recording scheme represents an apparatus which impacts liquid droplets onto a medium such as paper, thread, fiber, cloth, leather, metal, plastic, glass, wood, ceramics, etc., to perform image forming, and "image forming" represents not only providing a medium with an image which has a meaning such as a character, graph, etc., but also providing a medium with an image which does not have a meaning such as a pattern, etc. (merely impacting the liquid droplets onto the medium).

Furthermore, in the present embodiments, the term "liquid droplets" is not limited to what is called ink, so that what are called a recording liquid, a fixing solution, a resin, a liquid, etc., are included therein. Therefore, the term "liquid droplets" is used as a generic term for liquid droplets of all liquids which may be turned into liquid droplets by turning them into fine grains such that image forming is possible. Moreover, with respect to the term "recording medium", a material thereof is not limited to paper, so that an OHP sheet, cloth, etc., are also included therein, Therefore, the term means what the liquid droplets are affixed to and is used as a generic term for what includes media to be recorded on, recording paper, thin and thick paper, a post card, an envelope, just a sheet, etc. Furthermore, the image is not limited to a two-dimensional image, so that it also includes a three-dimensional image.

The present embodiments include a liquid droplet ejecting head including an electro-mechanical transducer element and an image forming apparatus including the liquid droplet ejecting head. Generally, the above-mentioned image forming apparatus is also called an "inkjet recording apparatus". Specific configuration examples of the liquid droplet ejecting head and the image forming apparatus will be described in detail in the below-described embodiments.

The inkjet recording apparatus has many advantages such as low noise, a possibility of high-speed printing, and a possibility of using plain paper, which is an inexpensive recording medium with a degree of freedom of ink. Therefore, it is widely used as an image forming apparatus or an image recording apparatus such as a multi-functional apparatus including multiple image forming functions such as a printer, a facsimile, a copying apparatus, a plotter, etc.

The liquid droplet ejecting apparatus used in the inkjet recording apparatus includes a nozzle which ejects ink droplets, etc., a liquid chamber (which may also be called an "ejecting chamber", a "pressurizing chamber", a "pressure chamber", "an ink flow path", etc.) to which the nozzle is communicatively connected; and a pressure generating unit for ejecting ink within the liquid chamber.

For the pressure generating unit in the present embodiments, a piezoelectric-type pressure generating unit, etc., are used, wherein the electro-mechanical transducer element such as a piezoelectric element is used to deform a vibrating plate forming a wall face of a liquid chamber to thereby cause ink droplets to be ejected. Moreover, in the present embodiments, the piezoelectric-type pressure generating unit includes a lateral vibration (bend mode) type pressure generating unit which uses deformation in a d31 direction.

(Liquid Droplet Ejecting Head)

An embodiment in which the electro-mechanical transducer element according to the present embodiment is applied to the liquid droplet ejecting head is described.

FIG. 1 is a schematic diagram illustrating one example of a structure of a liquid droplet ejecting head according to the present embodiment.

A liquid droplet ejecting head 10 used in the inkjet recording apparatus includes a nozzle plate 12 in which is formed a nozzle hole 11 for ejecting ink droplets; a liquid chamber 21 (also called an "ink flow path", a "pressurizing liquid chamber", a "pressurizing chamber", an "ejecting chamber", a "pressure chamber", etc.) to which this nozzle hole 11 is communicatively connected; an electro-mechanical transducer element 40 which pressurizes ink within the pressurizing chamber; and a vibrating plate 30 which forms a wall face of the ink flow path. The liquid chamber 21 is formed of a nozzle plate 12, a liquid chamber substrate 20, and a vibrating plate 30. Moreover, the electro-mechanical transducer element 40 includes a first electrode 42, an electro-mechanical transducer film 43, and a second electrode 44, while the liquid chamber 21 includes a pressure chamber substrate 20, a vibrating plate 30, and a nozzle plate 12. Upon receiving energy produced in the electro-mechanical transducer film, the vibrating plate 30, for example, is deformed and displaced in a lateral direction (a d31 direction) and ink droplets are caused to be ejected from a nozzle by pressurizing ink within the pressure chamber 21.

Moreover, in order to improve adhesion between the first electrode 42 and the vibrating plate 30, a contact layer 41 of Ti, $TiO_2$, TiN, Ta, $Ta_2O_5$, $Ta_3N_5$, etc., for example, may be provided on the vibrating plate 30.

While FIG. 1 is shown for an example in which the electro-mechanical transducer element of the present embodiment is applied to the liquid droplet ejecting head, the present invention is not limited thereto. The electro-mechanical transducer element according to the present embodiments may be used for applications such as a micro pump, an ultrasonic motor, an acceleration sensor, a dual-axis scanner for a projector, an infusion pump, etc., for example.

The electro-mechanical transducer element 40 is a piezoelectric-type electro-mechanical transducer element which is arranged in the side opposing the nozzle plate 12 and which causes the vibrating plate 30 which makes up a wall face of the liquid chamber 21 to be deformed and displaced to cause ink within the liquid chamber 21 to be ejected from the nozzle hole ii as ink droplets. The electro-mechanical transducer element 40 is deformed and displaced when a voltage is applied between the first electrode 42 (corresponding to a lower electrode) and the second electrode 44 (corresponding to an upper electrode).

As evident from FIG. 1, in the present embodiment, the electro-mechanical transducer element 40 has a film thickness distribution shape thereof of a shape being convex to the second electrode side in at least one cross section of the electro-mechanical transducer film 43. Therefore, as described below, compared to the related-art electro-mechanical transducer element, an efficient vibration, and deformation and displacement may be obtained. In the electro-mechanical transducer film 43, a shape of a cross section in a direction perpendicular to the cross section shown in FIG. 1 is normally rectangular. Below, in the present specification, a horizontal direction of the cross section shown in FIG. 1 may be called a "short-length direction", a vertical direction of the cross section shown in FIG. 1 may be called a "film thickness direction", and a direction perpendicular to the cross section shown in FIG. 1 may be called a "longitudinal direction".

The electro-mechanical transducer film according to the present embodiment preferably differs in an average composition in the film thickness direction between a center and an edge portion of the cross section shown in FIG. 1. More specifically, when lead zirconate titanate (PZT) is used as the electro-mechanical transducer film, the average composition in the film thickness direction preferably is such that Pb concentration decreases and Zr concentration increases in a direction from a center to an edge portion of the cross section shown in FIG. 1. Details will be described in the below-described third and fourth embodiments. In this way, an electro-mechanical transducer element is obtained which has high displacement properties and superior insulation properties.

Moreover, when the PZT is used as the electro-mechanical transducer film of the present embodiment, it is preferable to include, in the film thickness direction, a first layer of a composition of general PZT and a second layer whose Pb concentration is lower than that of the first layer and whose Zr concentration is higher than that of the first layer. Furthermore, it is preferable that the first layer and the second layer are mutually laminated in multiple numbers and a ratio of a film thickness of the first layer relative to a sum of the film thickness of the first layer and the film thickness of the second layer in the center is larger than the ratio in the edge portion. Details will be described in the below-described fourth embodiment. In this way, an electro-mechanical transducer element is obtained which has high displacement properties and superior insulation properties.

(Electro-Mechanical Transducer Film)

In the present embodiment, the PZT is mainly used as a material of the electro-mechanical transducer film 43. The PZT is specifically a solid solution of lead zirconate ($PbZrO_3$) and lead titanate ($PbTiO_3$).

A general formula of the PZT is shown with $Pb(Zr_m, Ti_{1-m})O_3$ (where $0<m<1$); for example, when a ratio of $PbZrO_3$ and $PbTiO_3$ is 53:47, it is shown as $Pb(Zr_{0.53}, Ti_{0.47})O_3$ in a chemical formula and as PZT (53/47) in general. The properties of PZT depend on the ratio of $PbZrO_3$ and $PbTiO_3$, so that a skilled person may obtain desired PZT properties by changing this ratio.

When using the PZT as the electro-mechanical transducer film, a lead acetate, a zirconium alkoxide compound, and a titanium alkoxide compound, which are used as starting materials, are dissolved in methoxyethanol as a common solvent to produce a PZT precursor solution. A skilled person may appropriately select an amount for mixing the lead acetate, the zirconium alkoxide compound, and the titanium alkoxide compound in accordance with a desired PZT composition (the ratio between $PbZrO_3$ and $PbTiO_3$).

A metal alkoxide compound is easily hydrolyzed by moisture in the atmosphere. Therefore, a stabilizer, such as acetylacetone, acetic acid, diethanolamine, etc., may be added to the PZT precursor solution as a stabilizer.

Complex oxides other than the PZT include barium titanate, etc.; in this case, using barium alkoxide and titanium alkoxide compounds as starting materials, a barium titanate precursor solution can also be manufactured by dissolving in a common solvent. Complex oxides with A=Pb, Ba, Sr; B=Ti, Zr, Sn, Ni, Zn, Mg, Nb as main components apply to such materials described with a general formula $ABO_3$. A specific description may be $(Pb_{1-x}, Ba)(Zr,Ti)O_3$, $(Pb_{1-x},Sr)(Zr,Ti)O_3$, which is a case in which Pb in site A is partially replaced by Ba and Sr. Such replacement is possible for a bivalent element, the effect of which is that an action of reducing characteristic deterioration due to evaporation of lead during the thermal process is demonstrated.

A method of forming the electro-mechanical transducer film 43 is described below.

(First Electrode and Second Electrode)

As a material for a first electrode, a material such as a metal, etc., which has a high heat resistance and which forms an SAM film by a reaction with alkanethiols as shown below, is preferably used. More specifically, platinum group metals such as ruthenium (Ru), rhodium (Rh), palladium (Pd), osmium (Os), iridium (Ir), platinum (Pt), etc., that are highly reactive to an SAM material, or alloy materials, etc., including these platinum group metals, may be used. Moreover, after producing these metal layers, a conductive oxide layer may be laminated to use the laminated result. More specifically, as the conductive oxide, there is a complex oxide, which is described with a chemical formula $ABO_3$ and which has A=Sr, Ba, Ca, La, B=Ru, Co, Ni as main components, including $SrRuO_3$, $CaRuO_3$; $(Sr_{1-x}Ca_x)O_3$, which is a solid solution thereof; as well as $LaNiO_3$, $SrCoO_3$, and $(La,Sr)(Ni_{1-y},Co_y)O_3$ (may be y=1), which is a solid solution thereof. Other oxide materials also include $IrO_2$, $RuO_2$.

As a method of manufacturing the first electrode, a method may be used such as a vacuum film forming method such as vacuum deposition and sputtering, etc.

Moreover, also as a material for the second electrode, a material such as a metal that has high heat resistance, etc., in the same manner as a material for the lower electrode may be used. As a method of manufacturing the second electrode, a method may be used such as a vacuum film forming method such as vacuum deposition, sputtering, etc.

A width in the short-length direction of the second electrode is generally formed at around 90% of a width in the short-length direction of the electro-mechanical transducer film.

(Vibrating Plate)

The first electrode is for an electrical connection as a common electrode for inputting a signal into the electro-mechanical transducer element, so that, for the vibrating plate 30 thereunder, an insulator or a conductor which is insulated may be used.

As a specific material of the vibrating plate 30, a silicon oxide film, a silicon nitride film, or a silicon oxynitride film of a thickness of generally a few microns, or a film in which these films are laminated, etc., may be used, for example. Moreover, a ceramic film such as a zirconia film, an aluminum oxide film, taking into account a thermal expansion difference, may also be used.

As a film forming method of the vibrating plate, a silicon-based insulating film may be obtained by a thermal oxidation process of a silicon-based film or CVD. The metal oxide film may be formed by sputtering, etc.

(Method of Forming Electro-Mechanical Transducer Film)

A method of forming an electro-mechanical transducer film according to the present embodiment is explained with reference to drawings.

A method of forming the electro-mechanical transducer film according to the present embodiment includes patterning the electro-mechanical transducer film using the Sol-gel method; and includes:

(1) modifying quality of surface of a first electrode formed on a substrate to a predetermined pattern;

(2) applying a Sol-gel solution including a precursor of the electro-mechanical transducer film by an inkjet scheme to a region on the first electrode, a quality of surface of which a region is not modified; and (3) thermally processing the applied Sol-gel solution.

((1) Modifying Quality of Software)

First, a method of surface treatment of a substrate for forming the electro-mechanical transducer film is described.

Figure 2:
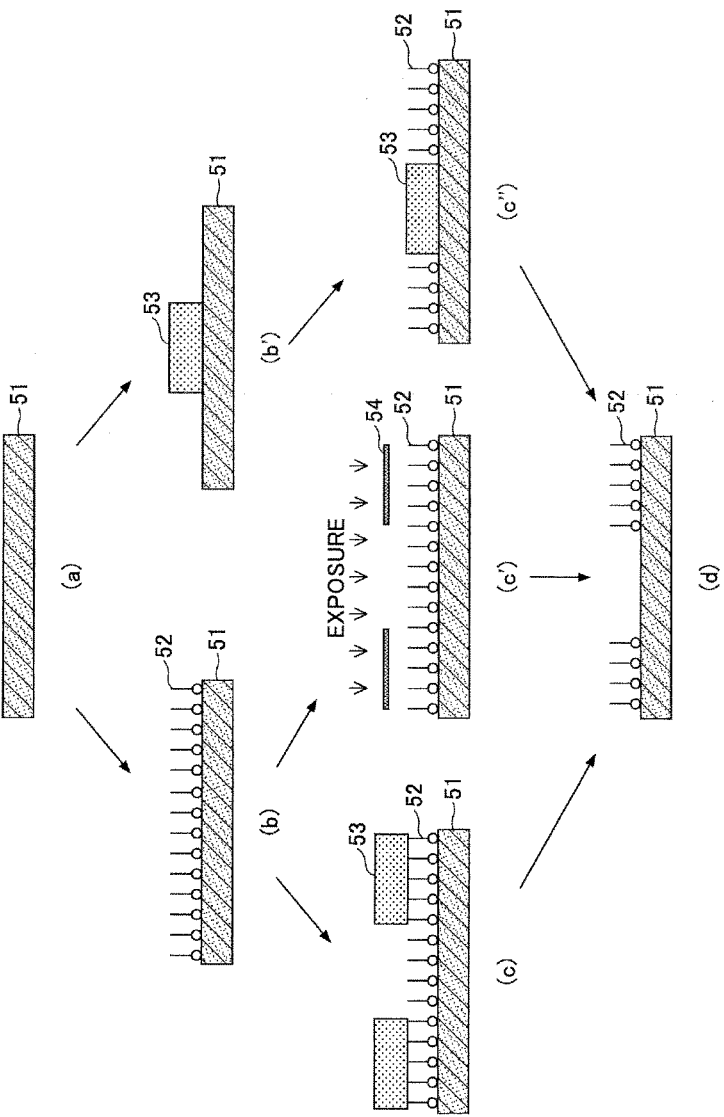
FIG. 2 is a schematic diagram for explaining one embodiment in which an SAM film is patterned onto a substrate.

FIG. 2 shows a schematic diagram for explaining one embodiment in which an SAM (a Self Assembled Monolayer) is patterned onto the substrate.

(a) in FIG. 2 is a substrate 51, which is a first electrode, for example. In the present embodiment, platinum (Pt) is used as the first electrode.

A soaking process is performed on the substrate 51 using an SAM material including alkanethiols, etc. ((b) in FIG. 2). In this way, on the surface of the substrate 51 the SAM material reacts, so that the SAM film 52 is affixed thereto, making it possible to make the surface of the substrate 51 water repellent. Alkanethiols, which vary in reactability and hydrophobicity (water repellency) depending on a molecular chain length, are normally produced by dissolving a molecule with the number of carbon atoms between 6 and 18 in an organic solvent such as alcohol, acetone, toluene, etc. Normally, a concentration of alkanethiols is approximately a few mols/liter.

After a predetermined time period, the substrate 51 is taken out, excessive molecules undergo replacement cleaning by the solvent and drying.

Next, a pattern of a photoresist 53 is formed by a known photolithography ((c) in FIG. 2). Then, an SAM film is removed by dry etching, the photoresist 53 is removed to complete patterning of the SAM film ((d) in FIG. 2).

Alternatively, from a state of (a) in FIG. 2, a photoresist pattern is formed first ((b') in FIG. 2), an SAM process is performed ((c") in FIG. 2), a resist is removed to perform patterning of the SAM film 52.

Moreover, alternatively, from a state of (b) in FIG. 2, ultraviolet rays or oxygen plasma may be irradiated onto a substrate surface via the photomask 54 ((c') in FIG. 2) to remove the SAM film 52 of an exposing unit to perform patterning of the SAM film 52.

A surface of a region in which the SAM film remains after patterning becomes hydrophobic. On the other hand, a region in which the SAM film is removed by dry etching, etc., and whose surface is an electrode material becomes hydrophilic. A contrast of the surface energy can be used to coat the PZT precursor solution differently as described in detail below.

(Steps in (2)-(3))

Next, forming the electro-mechanical transducer film by repeating application of a Sol-gel solution on and thermally processing the first electrode, a quality of surface of which was modified.

FIGS. 3A to 3F show schematic diagrams for explaining one embodiment in which the electro-mechanical transducer film is formed on a substrate, quality of surface of which was modified.

Figure 3A:
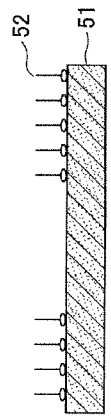
FIGS. 3A to 3F are schematic diagrams for explaining one embodiment in which an electro-mechanical transducer film is formed on a substrate, a quality of surface of which was modified.
Figure 3B:
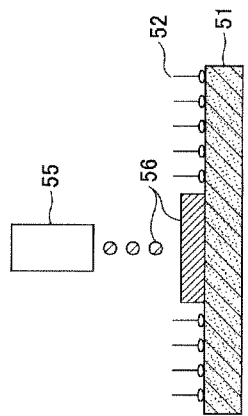

In the substrate, quality of surface of which was modified that was described in FIG. 2, a patterned SAM film remains even after releasing the resist in a region in which a photoresist remains after photolithography, so that the region becomes hydrophobic. On the other hand, in a region in which the photoresist is removed by photolithography, the SAM film is removed by dry etching and a surface thereof is an electrode material, so that the surface is hydrophilic (FIG. 3A).

Thereafter, a Sol-gel solution 56 which includes a precursor such as the PZT, etc. is applied by an inkjet recording head 55 by an inkjet scheme ((b) in FIG. 2). In order to make it possible to apply with the inkjet recording head 55, it is preferable to adjust the viscosity, surface tension, etc., of the Sol-gel solution 56 in advance. In (b) in FIG. 2, due to a contrast in surface energy, a region in which the Sol-gel solution is to be applied is only a hydrophilic region. The Sol-gel solution can be ejected onto only the region of a hydrophilic face to decrease an amount of use of the Sol-gel solution to be applied relative to a related art process such as spin coating, etc., and to simplify the process.

Figure 3C:
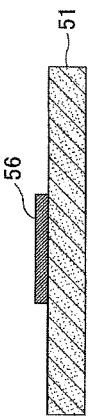

After applying the sol-gel solution by the inkjet scheme, infrared rays are irradiated by an infrared ray heating apparatus (not shown), for example, to perform a thermal process (FIG. 3C). The thermal process here includes the step of drying a solvent component included in a Sol-gel solution film; the step of thermally decomposing the dried Sol-gel solution film; and the step of crystallizing the thermally decomposed Sol-gel solution film. Here, the respective steps may be performed independently, or they may be carried out consecutively.

Figure 3D:
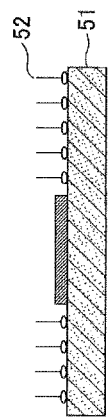
Figure 3E:
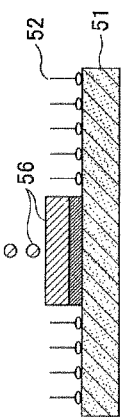
Figure 3F:
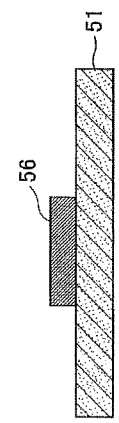

The process continues with washing by isopropyl alcohol as a repetitive process, after which an SAM film is formed in a similar soaking process. In the second step and beyond, the SAM film is not formed on an oxide film, so that the photolithography step is not necessary as shown in FIG. 3D. Next, alignment is performed on an electro-mechanical transducer film formed the first time, and again the Sol-gel solution is applied by the inkjet applying apparatus (FIG. 3E). A wet-on-wet coated PZT film is obtained via the same thermal process as the first time (FIG. 3F). Thereafter, until a desired film thickness is obtained, these steps may be repeated multiple times.

As described above, after the crystallization step, formation of the SAM film, application of the Sol-gel solution, and a thermal process are applied as repetitive processes. In the present embodiment, it is preferable for a surface of the PZT film to undergo light etching before the formation of the SAM film in the repetitive processes. While details will be discussed in the below-described fourth embodiment, it is preferable since a PZT film with a high voltage resistance is obtained by light etching.

The method of forming the electro-mechanical transducer film according to the present embodiment makes it possible to normally form the electro-mechanical transducer film of up to around 5 μm in film thickness.

As described above, the present embodiment includes applying the Sol-gel solution which includes the precursor of the PZT with an inkjet scheme. Therefore, compared to a related art method of applying by a spin coater, an amount of starting material required is small and it is possible to simplify the process.

While a pattern formed with the inkjet scheme is in a liquid state after application, and a cross section of an electro-mechanical transducer thereof gradually increases in size in a direction from the edge portion to the center portion and takes a convex film thickness distribution shape to the second electrode side, the film thickness is shown as uniform for brevity in FIGS. 3A to 3F.

(First Embodiment)

From now on, the present invention is described in more detail by describing an embodiment.

A quality of surface of a substrate, which a Pt electrode is formed on the surface of the substrate by sputtering, is modified by the above-described step of modifying a quality of surface. As an SAM film, alkanethiol ($CH_3(CH_2)$-SH) is used.

An angle of contact with respect to pure water of the SAM film formed in the first embodiment is 92 degrees, while an angle of contact of Pt on the substrate whose SAM film is removed is 54 degrees. This means that a quality of surface of a portion in which the SAM film is formed is modified to hydrophobic (in other words, a Pt portion is hydrophilic) by the SAM film.

A PZT precursor solution is applied to a patterned hydrophilic region by a below-described inkjet applying apparatus.

Figure 4:
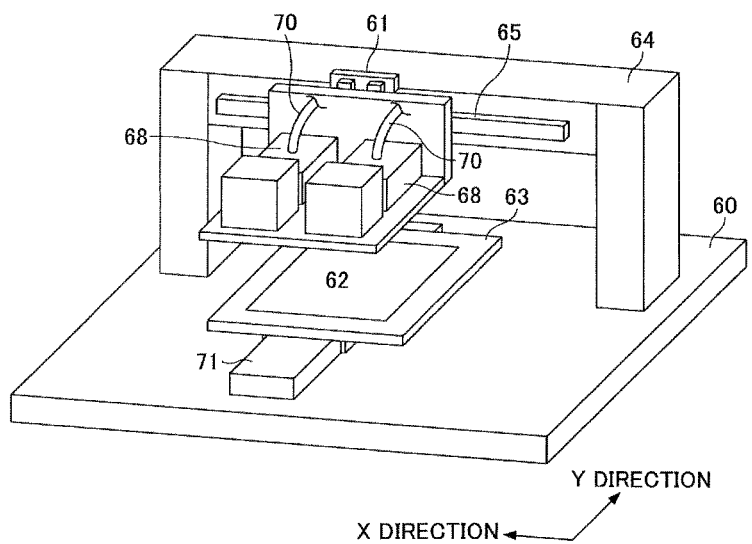
FIG. 4 is a schematic perspective diagram for explaining one example of an inkjet applying apparatus which can be used in a first embodiment.

FIG. 4 is a schematic perspective diagram for explaining one example of the inkjet applying apparatus which can be used in the first embodiment.

As shown in FIG. 4, a Y-axis drive unit 61 is installed on a platform 60. On the Y-axis drive unit 61 is installed a stage 63 which has installed thereon a substrate 62 such that the stage 63 can drive in a Y-axis direction. The stage 63 has provided thereon an adsorbing unit which adsorbs static electricity, a vacuum (not shown), etc., and has the substrate 62 fixed thereto.

Moreover, an X-axis drive unit 65 is installed on an X-axis supporting member 64. A head base 66, which is mounted on a Z-axis drive unit 71, is installed on the X-axis drive unit 65, and the head base 66 is arranged to be able to move in an X-axis direction. On the head base 66 is mounted a liquid droplet ejecting head 68 which is also called a "liquid ejecting head" that ejects a PZT precursor solution. To this liquid droplet ejecting head 68 is supplied the PZT precursor solution via a PZT precursor solution supplying pipe 70 from a PZT precursor solution storage tank (not shown).

As a starting material for the PZT precursor solution, lead acetate trihydrate, titanium isopropoxide, and zirconium isopropoxide are used. Combined water of lead acetate is dissolved in methoxyethanol, after which it is dehydrated. An amount of use of the starting material is adjusted to be 10 mol % excess relative to the stoichiometric composition. This makes it possible to prevent a decrease in crystallizability due to lead falling out in the thermal process. Titanium isopropoxyde and zirconium isopropoxide are dissolved in methoxyethanol, subjected to an alcohol exchange reaction and an esterification reaction, and mixed with a methoxyethanol solution in which is dissolved the above-described lead acetate to synthesize a PZT precursor solution. The concentration of the PZT precursor solution was adjusted to be 0.1 mol/liter.

The film thickness of the PZT film obtained in one time film forming is preferably around 0.1 µm, and the concentration of the PZT precursor solution is optimized in view of a relationship between a film forming area and a precursor applying amount.

The substrate on which the PZT precursor solution is applied is thermally processed at approximately 120° C. to apply solvent drying, after which thermal decomposition of organic matter is performed at approximately 500° C. to obtain the PZT film. The film thickness of the PZT precursor film obtained is 0.09 µm.

The process continues with washing by isopropyl alcohol, after which an SAM film is formed in a similar soaking process. Here, an angle of contact with respect to pure water of the SAM film formed is 92°, while an angle of contact with respect to pure water of the PZT precursor applied film is 34°.

Next, the PZT precursor solution is applied again by the inkjet applying apparatus in alignment on the PZT film formed the first time, and then the PZT precursor applied film of a film thickness of 0.18 µm is obtained by a thermal process similar to that for the PZT film formed the first time.

This process is further repeated four times (for a total of six times of thermal process and application of the PZT) and the PZT precursor applied film of 0.54 µm is obtained, after which it undergoes a crystallization thermal process. The crystallization thermal process is carried out at a temperature of approximately 700° C. in a rapid thermal process (RTA) to obtain a PZT film. No defects such as cracks occur in the PZT film obtained.

Moreover, six times of the SAM film process, selective application of the PZT precursor solution, solvent drying at approximately 120° C. and a process of thermal decomposition at approximately 500° C. are performed and a crystallization thermal process which is the same as what is described above is performed to obtain a PZT film with a film thickness of approximately 1 µm. No defects such as cracks occur in the PZT film obtained.

On the obtained PZT film is formed Platinum as the second electrode to obtain electro-mechanical transducer element according to the first embodiment.

Electrical properties and electro-mechanical transducing capabilities (piezoelectric constant) were evaluated for the electro-mechanical transducer element obtained.

Figure 5:
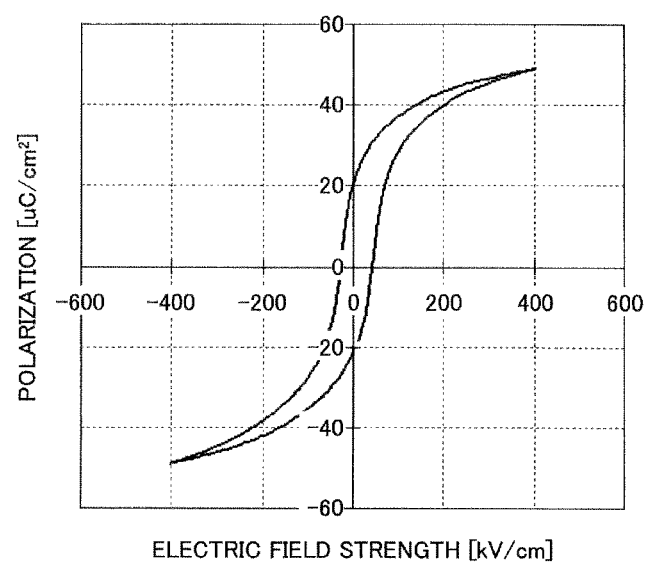
FIG. 5 is a diagram illustrating an example of a P-E hysteresis curve of an electro-mechanical transducer element according to the first embodiment.

FIG. 5 shows an example of a P-E hysteresis curve of the electro-mechanical transducer element obtained in the first embodiment. For the electro-mechanical transducer element obtained in the first embodiment, a relative permittivity is 1220, a dielectric loss is 0.02, a residual polarization is 19.3 $\mu C/cm^2$, and a coercive electric field is 36.5 kV/cm. In this way, it is demonstrated that the electro-mechanical transducer element obtained in the first embodiment has electrical properties equivalent to those of a related art ceramic sintered body.

The electro-mechanical transducing capability of the electro-mechanical transducer element is calculated by measuring a deformation amount due to electric field application with a laser Doppler vibrometer and calibrating by a simulation. The piezoelectric constant d31 of the electro-mechanical transducer element obtained in the first embodiment is 120 pm/V. This means that the electro-mechanical transducer element obtained has a characteristic value which can be applied as a liquid droplet ejecting head.

Pattern dimensions of the PZT film finally formed in the present embodiment is 1000×60 µm. FIG. 6 shows results of measurement, by a laser Doppler meter, of a displacement amount relative to a location in a short-length direction in the electro-mechanical transducer element obtained in the first embodiment. In FIG. 6, a horizontal axis shows the location in the short-length direction in an actuator unit of the electro-mechanical transducer, while a vertical axis shows the displacement amount of the actuator unit. Moreover, a curve (a) in FIG. 6 is for the electro-mechanical transducer element obtained in the present embodiment, while a curve (b) in FIG. 6 is for the electro-mechanical transducer element formed in the same dimensions by a spin method (Reference example).

Figure 7A:
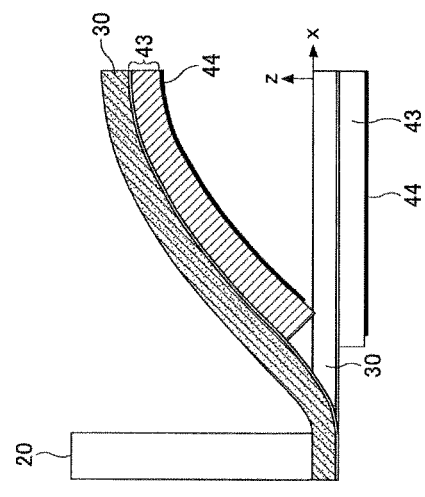
FIGS. 7A and 7B are schematic diagrams for explaining a manner of deformation of the electro-mechanical transducer film according to the first embodiment.
Figure 7B:
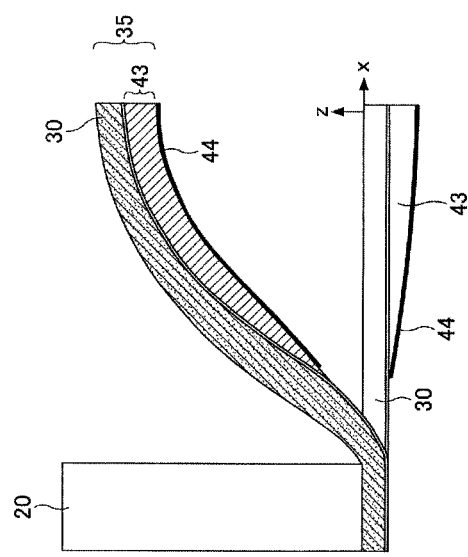

Moreover, FIGS. 7A and 7B are schematic diagrams for explaining a manner of deformation of the electro-mechanical transducer film obtained in the first embodiment. Similar to FIG. 6, a curve in FIG. 7A is for the electro-mechanical transducer element obtained in the present embodiment, while a curve in FIG. 7B is for the electro-mechanical transducer element formed in the same dimensions by the spin method (Reference example). For the purpose of explanations, a scale in a vertical axis is amplified 50 times in FIGS. 7A and 7B.

The whited-out figures shown on the lower side in FIGS. 7A and 7B show respective cross section shapes in an actuator portion 35 of the electro-mechanical transducer element when a voltage is not applied. The actuator portion 35 shows a laminated structural body portion from the vibrating plate 30 as a substrate 1 to the second electrode 44 which is arranged with a PZT film as an electro-mechanical transducer film 43 placed therebetween and represents a drive portion which is actually deformed and displaced when a voltage is applied thereto.

As evident from FIG. 7A, a cross section of the PZT film obtained in the present embodiment has a film thickness distribution shape which is convex to the second electrode side, so that a film thickness is small at an edge portion of the PZT film, a vibrating plate near the PZT edge portion is greatly deformed, and a displacement amount of a center portion of the PZT film becomes large relative to the related art case.

On the other hand, the PZT film manufactured by the spin method in FIG. 7B is uniform in film thickness, so that deformation of the vibrating plate is hindered near the PZT edge portion, and a maximum displacement amount at the PZT center portion is also small relative to that for FIG. 7A.

As a variation of the first embodiment, without arranging the second electrode, six times of the SAM film process, selective application of the PZT precursor solution, solvent drying at approximately 120° C., and a thermal decomposition process at approximately 500° C. are performed, and a crystallization thermal process is further performed, and these steps are repeated 10 times to make it possible to manufacture a PZT film having a film thickness of approximately 5 μm. The PZT film obtained does not have any defects such as cracks, etc.

As described above, an electro-mechanical transducer element according to the first embodiment includes a first electrode formed on a substrate; an electro-mechanical transducer film formed on at least a part of the first electrode; and a second electrode formed on at least a part of the electro-mechanical transducer film, wherein, in at least one cross section of the electro-mechanical transducer film, a film thickness distribution shape is convex to the second electrode side. Therefore, compared to the related-art electro-mechanical transducer element manufactured by the spin method, an efficient vibration, and deformation and displacement may be obtained.

(Second Embodiment)

Using a method similar to that in the first embodiment, a step of modifying a quality of surface of a first electrode formed on a ground to a predetermined pattern; a step of applying a Sol-gel solution including a precursor of the electro-mechanical transducer film by an inkjet scheme to a region, a quality of surface of which a region is not modified, on the first electrode; and a step of thermally processing the applied Sol-gel solution are repeated to obtain a PZT film according to a second embodiment.

A width in a short-length direction (in a cross section in a direction perpendicular to a longitudinal direction) is approximately 52 μm, while a thickness (in other words, a maximum film thickness) at a center portion in the short-length direction is approximately 2 μm.

Figure 8:
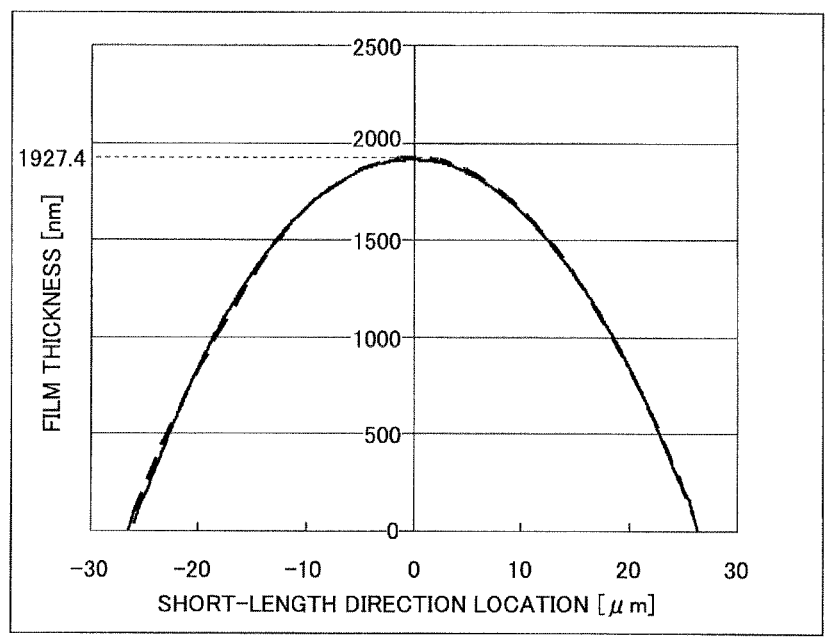
FIG. 8 is a schematic diagram for explaining an example of a film thickness distribution shape of the electro-mechanical transducer film according to a second embodiment.

FIG. 8 is a schematic diagram for explaining an example of a film thickness distribution shape of the electro-mechanical transducer film according to the second embodiment. More specifically, a solid line in FIG. 8 is a measurement result in which a film thickness in a cross section in a direction perpendicular to a longitudinal direction of the electro-mechanical transducer film obtained in the second embodiment is measured using a surface roughness meter, while a broken line in FIG. 8 is a curve in which a film thickness distribution shape of the electro-mechanical transducer film according to the second embodiment is approximated by a polynomial approximation.

As evident from FIG. 8, it is seen that the electro-mechanical transducer film obtained in the second embodiment has a film thickness distribution shape which is convex to the second electrode side and which indicates a very good match with an approximation formula of a quadratic function of $$y = -ax^2 + b \quad \text{(Equation 1)}.$$

More specifically, in the second embodiment, x shows a location (μm) in a direction perpendicular to a film thickness direction in a cross section with a cross section center of the electro-mechanical transducer film being set to 0, and, when y represents a film thickness (μm) of the electro-mechanical transducer film in x, a very good match is indicated with a quadratic function of $y = -2.64x^2 + 1927.4$.

Equation 1: in order to examine a relationship between a coefficient a and a constant b in $y = -ax^2 + b$, multiple electro-mechanical transducer films which differ in a width in a short-length direction and a film thickness at a center portion in the short-length direction are formed according to the same method as the first embodiment, and an approximation equation of a quadratic function for the respective electro-mechanical transducer films is determined by polynomial approximation. As a result, in either of the embodiments, a fulfills a relationship of $0.8 \times ((4Tm)/Wp^2) < a < 1.2 \times ((4Tm)/Wp^2)$ using a film thickness Tm (μm) at a center portion in the short-length direction and a width Wp (μm) in the short-length direction, while b fulfills a relationship of $0.8Tm < b < 1.2 Tm$.

Moreover, for these multiple electro-mechanical transducer elements, a relationship between a width Wp (μm) in a short-length direction (an x-axis direction) of the electro-mechanical transducer film, (a maximum) film thickness Tm (μm) of the electro-mechanical transducer film at a cross section center in this short-length direction, a width We (μm) in a short-length direction of the second electrode, and a film thickness Te of the electro-mechanical transducer film at an edge portion of the second electrode is determined using a polynomial approximation. As a result, it is seen that there is a relationship of $$Te/Tm = -(We/Wp)^2 + 1 \quad \text{(Equation 2)}$$

for all of the electro-mechanical transducer elements.

In general, dielectric breakdown of the electro-mechanical transducer film occurs at a location at which a distance between the first electrode and the second electrode becomes minimal. In other words, in the electro-mechanical transducer film according to the present embodiment, dielectric breakdown occurs in the electro-mechanical transducer film corresponding to an edge portion of the second electrode. Therefore, in order to secure a desired withstand pressure for the electro-mechanical transducer film, a desired parameter (a film thickness, a width, for example) for the second electrode and/or the electro-mechanical transducer film can be determined in advance using the above-described Equation (1) and Equation (2).

As a specific embodiment, using the same method as the method described above, the electro-mechanical transducer element with Wp of 50 μm, We of 42 μm, Tm of 2000 μm and the electro-mechanical transducer element with Wp of 50 μm, We of 48 μm, and Tm of 2000 μm are made.

Figure 9:
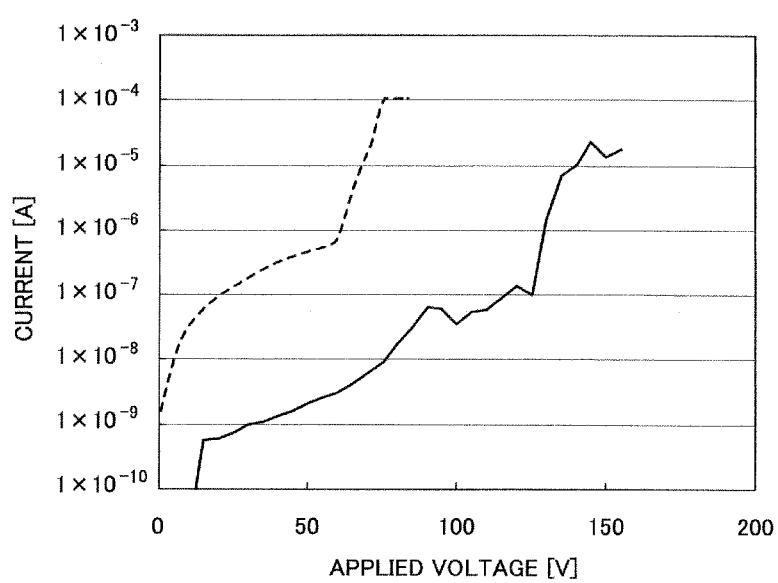
FIG. 9 is a schematic diagram for explaining a relationship between an applied voltage value and a current value in the electro-mechanical transducer film according the present embodiment.

FIG. 9 shows a schematic diagram for explaining a relationship between an applied voltage value and a current value in the electro-mechanical transducer film according to the present embodiment. In FIG. 9, data in a solid line are data for the electro-mechanical transducer film with We of 42 μm, while data in a broken line are data for the electro-mechanical transducer film with We of 48 μm. As evident from FIG. 9, for data in the broken line with a large width We of the electro-mechanical transducer film, a current amount drastically increases when 50V is exceeded, so that dielectric breakdown occurs, while, for data in the solid line, no dielectric breakdown occurs up to around 130V.

For the present embodiment, a value of a voltage at which dielectric breakdown occurs depends on a difference in film thickness Te of the electro-mechanical transducer films at an edge portion of the second electrode when other parameters are the same, and with a smaller We, Te becomes large and the value of voltage of the dielectric breakdown becomes large.

When a relationship between Tm, We, and Wp, and an applied voltage is examined for multiple electro-mechanical transducer films, it is seen that dielectric breakdown does not occur even when an applied voltage by which a desired displacement amount is obtained as an actuator is applied over a long time period when a relationship of $$0.4 < -Tm \times (We/Wp)^2 + Tm \quad \text{(Equation 3)}$$

is fulfilled.

As described above, according to the second embodiment are included a first electrode formed on a substrate; an electro-mechanical transducer film formed on at least a part of the first electrode; and a second electrode formed on at least a part of the electro-mechanical transducer film, wherein, in at least one cross section of the electro-mechanical transducer film, a film thickness distribution shape is convex to the second electrode side and the film thickness distribution shape is approximated by Equation 1: $y=-ax^2+b$. This means that the electro-mechanical transducer film formed by an inkjet method is self assembled at the time of solvent drying to a film thickness distribution shape approximated by a quadratic function in Equation 1. By having the film thickness distribution shape which is approximated by the quadratic function in Equation 1, the electro-mechanical transducer element according to the present embodiment may obtain an efficient vibration and deformation and displacement.

(Third Embodiment)

Using a method similar to that in the first embodiment, a step of modifying quality of surface of a first electrode formed on a substrate to a predetermined pattern; a step of applying a Sol-gel solution including a precursor of the electro-mechanical transducer film by an inkjet scheme to a region on the first electrode, a quality of surface of which a region is not modified; and a step of thermally processing the applied Sol-gel solution are repeated to obtain a PZT film according to a third embodiment.

A film thickness at a center portion in a short-length direction (in other words, a maximum film thickness) of the PZT film according to the third embodiment is approximately 2000 nm. It is designed such that, for the PZT film according to the third embodiment, a length in the short-length direction becomes approximately 50 μm, while a length in the longitudinal direction becomes approximately 1000 μm.

On the obtained PZT film is formed Platinum as a second electrode to obtain the electro-mechanical transducer film according to the third embodiment.

Electrical properties and electro-mechanical transducing capabilities (piezoelectric constant) were evaluated for the electro-mechanical transducer element obtained.

Figure 10:
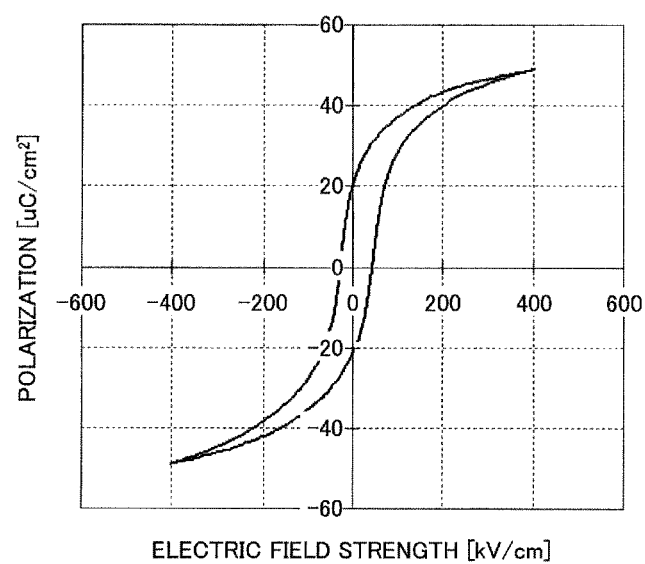
FIG. 10 is a diagram illustrating an example of a P-E hysteresis curve of the electro-mechanical transducer element according to a third embodiment.

FIG. 10 shows an example of a P-E hysteresis curve of the electro-mechanical transducer element according to the third embodiment.

For the electro-mechanical transducer element obtained in the third embodiment, a relative permittivity is 1220, a dielectric loss is 0.02, a residual polarization is 19.3 μC/cm$^2$, and a coercive electric field is 36.5 kV/cm. In this way, it is demonstrated that the electro-mechanical transducer element obtained in the third embodiment has electrical properties equivalent to those of a conventional ceramic sintered body.

The electro-mechanical transducing capability of the electro-mechanical transducer element is calculated by measuring a deformation amount due to electric field application with a laser Doppler vibrometer and calibrating by a simulation. The piezoelectric constant d31 of the electro-mechanical transducer element obtained in the third embodiment is 120 pm/V. This means that the electro-mechanical transducer element obtained has a characteristic value which can be applied as a liquid droplet ejecting head. A maximum applied voltage of the electro-mechanical transducer film at the time of the measurement is 50V.

Figure 11:
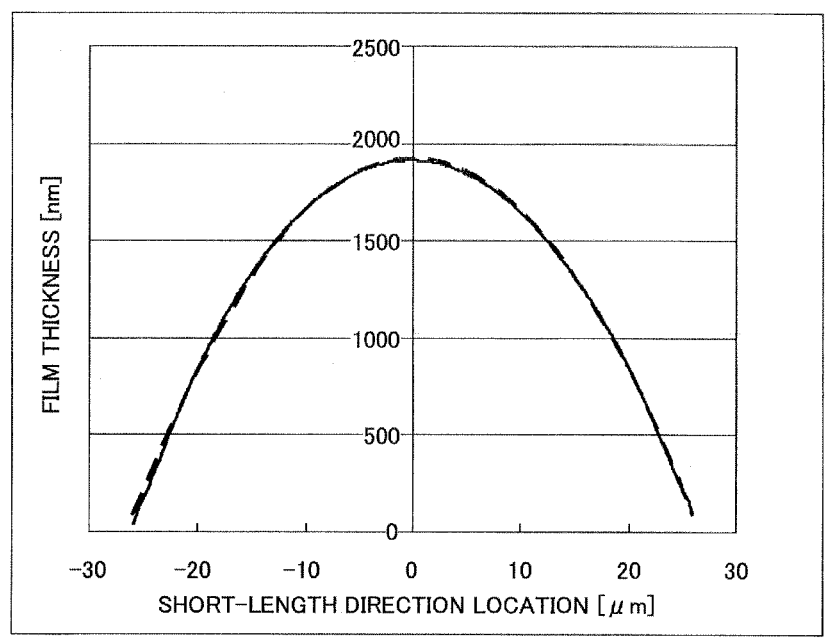
FIG. 11 is a schematic diagram for explaining one example of a film thickness distribution shape of the electro-mechanical transducer film according to the third embodiment.

FIG. 11 shows a schematic diagram for explaining an example of a film thickness distribution shape of the electro-mechanical transducer film according to the third embodiment. More specifically, a solid line in FIG. 11 is a measurement result in which a film thickness in a cross section in a direction perpendicular to a longitudinal direction of the electro-mechanical transducer film obtained in the third embodiment is measured using a surface roughness meter, while a broken line in FIG. 11 is a curve in which a film thickness distribution shape of the electro-mechanical transducer film according to the third embodiment is approximated by a polynomial approximation.

As evident from FIG. 11, it is seen that a cross section of the electro-mechanical transducer film according to the third embodiment has a film thickness distribution shape which is convex to the second electrode side and which indicates a very good match with an approximation formula of a quadratic function of $y=-ax^2+b$ (Equation 1). More specifically, a relationship of $y=-(4Tm)/Wp^2x^2+Tm$ is fulfilled.

In general, dielectric breakdown of the PZT film occurs at a location at which a distance between the first electrode and the second electrode is shortest. For the PZT film according to the present embodiment, the edge portion of the second electrode corresponds to the location. When a width in the short-length direction of the second electrode is set to be 90% of the width in the short-length direction of the PZT film, the film thickness of the PZT film at the edge portion of the second electrode becomes approximately 0.38 μm. A voltage resistance of the PZT film that is calculated from the above-described maximum applied voltage and the film thickness becomes 1300 kV/cm. The voltage resistance of the PZT film formed uniformly on the first electrode of the related art is around 1000 kV/cm, so that the voltage resistance for the PZT film of the present embodiment becomes high.

The reason that the PZT film according to the present embodiment has a high voltage resistance is described as follows. Table 1 shows one example of results of an energy distribution-type X-ray analysis (EDX) of a center portion and an edge portion in the short-length direction in the PZT film according to the third embodiment.

TABLE 1

|  | Pb CONCENTRATION (atom %) | Zr CONCENTRATION (atom %) | Ti CONCENTRATION (atom %) |
| --- | --- | --- | --- |
| CENTER PORTION | 58 | 22 | 20 |
| EDGE PORTION | 31 | 39 | 30 |

As evident from Table 1, for the PZT film according to the present embodiment, a composition at the center portion has a standard PZT composition, while, with the composition at the edge portion, a Pb concentration is low and a Zr concentration is high. In other words, for the electro-mechanical transducer film of the present embodiment, the average composition in the film thickness direction is different between the center portion and the edge portion. Moreover, as a result of performing an X-ray photoelectron spectroscopy (XPS) for the edge portion in the short-length direction of the PZT film according to the third embodiment, it is seen that the PZT film at the edge portion has zirconium oxide.

For the PZT film according to the present embodiment, the film thickness distribution shape is convex to the second electrode side, the film thickness at the edge portion in the short-length direction is small relative to that at the center portion in the short-length direction. Therefore, it is considered that, at the time of drying after applying the Sol-gel solution, Pb fallout from the edge portion occurs, zirconium oxide is formed, resulting in improved insulating properties.

On the other hand, when zirconium oxide is formed at the time of forming a PZT film by a Sol-gel method, a piezoelectric constant d31 which indicates displacement properties tends to fall. However, for the PZT film according to the present embodiment, the composition at the center portion in the short-length direction is a standard composition (Pb fallout is small), so that the PZT film has high displacement properties and has obtained good insulating properties.

(Fourth Embodiment)

Using a method similar to that in the first embodiment, a step of modifying a quality of surface of a first electrode formed on a substrate to a predetermined pattern; a step of applying a Sol-gel solution including a precursor of the electro-mechanical transducer film by an inkjet scheme to a region on the first electrode, a quality of surface of which a region is not modified; and a step of thermally processing the applied Sol-gel solution are applied in a fourth embodiment. After a crystallization process in the step of thermally processing, a surface of a PZT film is light etched for one minute with hydrochloric acid with a concentration of 0.1 wt %. Thereafter, formation of a SAM film, application of a Sol-gel solution, a thermal process of the Sol-gel solution, and light etching of the PZT film are repeated and a total of 24 times of film forming are carried out to obtain the PZT film according to the fourth embodiment.

Figure 12:
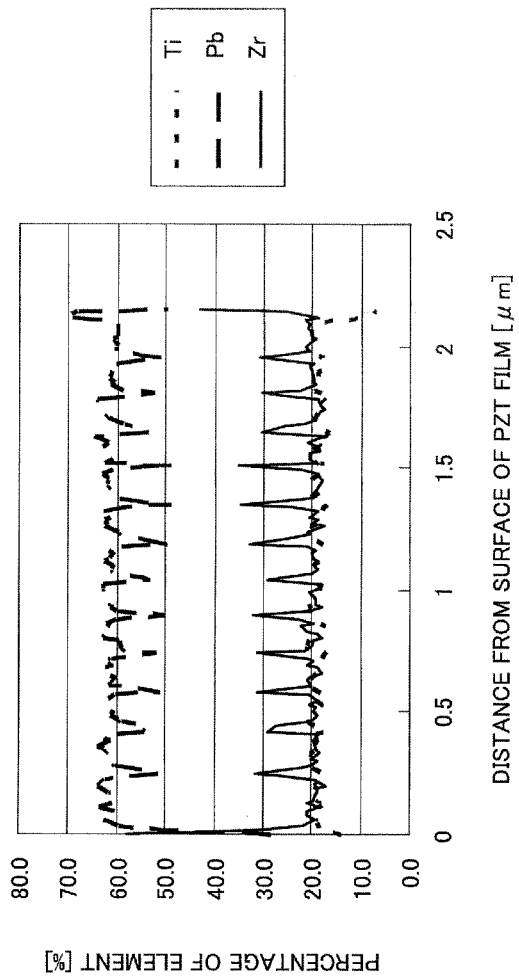
FIG. 12 is a diagram illustrating one example of an EDX analysis in a film thickness direction of the electro-mechanical transducer film according to a fourth embodiment.
Figure 13:
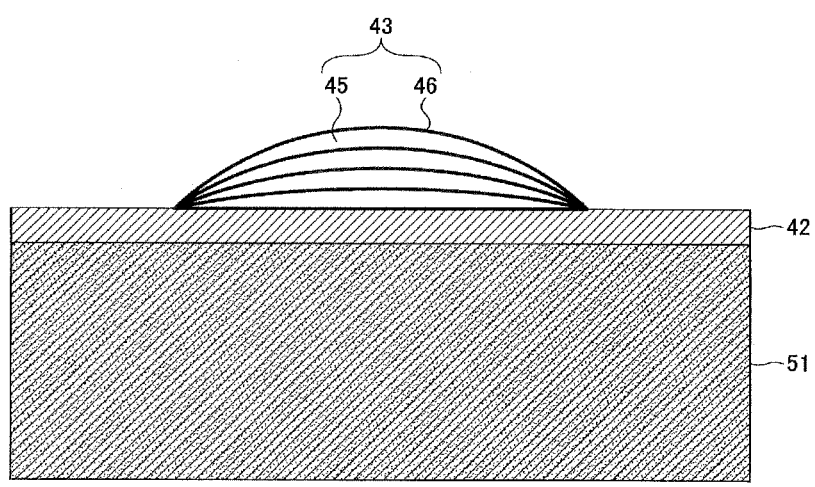
FIG. 13 is a schematic diagram for explaining a distribution of Zr of the electro-mechanical transducer film according to the fourth embodiment.

FIG. 12 shows one example of a result of an EDX analysis in a film thickness direction of the PZT film according to the fourth embodiment. Moreover, FIG. 13 shows a schematic diagram for explaining a distribution of Zr of the electro-mechanical transducer film according to the fourth embodiment. In FIG. 13, for brevity of explanations, only the substrate 51, the electrode 42, and the electro-mechanical transducer film 43 are shown.

The horizontal axis in FIG. 12 is a distance from a surface in the film thickness direction of the PZT film and the horizontal axis is a percentage of the respective elements. As shown in FIG. 12, Pb on the PZT surface after crystallization is chemically etched by applying a step of light etching, so that a Zr-rich layer of around 20 nm is formed in the present embodiment. Normally, the above described repetitive processes are applied until a desired film thickness is obtained, so that a PZT layer 45 and a Zr-rich layer 46 are mutually laminated in multiple numbers as shown in FIG. 13. Moreover, this Zr-rich layer 46 is considered to include a part thereof as zirconium oxide, so that it is in a state close to an insulator film.

The Zr-rich layer 46 is formed for around 20 nm for each time of crystallization, not depending on an applied film thickness of the PZT film for each time. Therefore, in the PZT film whose film thickness distribution shape is convex to the second electrode side, a percentage of zirconium oxide becomes larger at the edge portion in the short-length direction relative to that at the center portion in the short-length direction as shown in FIG. 13. In other words, a ratio of a film thickness of the PZT layer relative to a sum of the film thickness of the PZT layer and a film thickness of the Zr-rich layer becomes larger than a ratio at the edge portion. Thus, a PZT film is obtained with high displacement properties and good insulating properties similar to the third embodiment.

Table 2 shows one example of results of an energy distribution-type X-ray analysis (EDX) of a center portion and an edge portion in the short-length direction in the PZT film according to the fourth embodiment.

TABLE 2

| | Pb CONCENTRATION (atom %) | Zr CONCENTRATION (atom %) | Ti CONCENTRATION (atom %) |
|---|---|---|---|
| CENTER PORTION | 52 | 27 | 21 |
| EDGE PORTION | 27 | 42 | 31 |

As shown in Table 2, for the PZT film according to the present embodiment, the Zr concentration at the edge portion becomes larger in comparison to the above-described embodiment in which light etching is not applied. Therefore, it is made possible to obtain a PZT film having higher displacement properties and better insulating properties.

On the obtained PZT film according to the fourth embodiment is formed Platinum as a second electrode to obtain the electro-mechanical transducer film according to the fourth embodiment.

Electrical properties and electro-mechanical transducing capabilities (piezoelectric constant) were evaluated for the electro-mechanical transducer element obtained. For the PZT film according to the fourth embodiment, the piezoelectric constant d31 is 121 pm/V and the voltage resistance is 2000 kV/cm.

(Fifth Embodiment)

In the fifth embodiment, an embodiment is described in which an electro-mechanical transducer element according to the previously-described embodiment is applied to a liquid droplet ejecting head.

A configuration of the liquid droplet ejecting head to which the electro-mechanical transducer element according to the previously-described embodiment is applied is described in FIG. 1, etc.

For a liquid droplet ejecting head according to the present embodiment, a configuration in which the liquid droplet ejecting head in FIG. 1 is arranged in multiple numbers is used.

The liquid droplet ejecting head according to the present embodiment may be made by manufacturing the electro-mechanical transducer element in the above-described embodiments and then the manufactured electro-mechanical transducer element is etched from the back face thereof for making a liquid chamber 21 and a nozzle plate 12 having a nozzle hole 11 is joined thereto. Therefore, a liquid droplet ejecting head having performance equivalent to a related art liquid droplet ejecting head may be manufactured with a simple manufacturing step.

Moreover, in FIG. 1 and the present embodiment a case is described of applying to an inkjet head as one usage example of a liquid droplet ejecting head. However, the present embodiment is not limited thereto. For example, it may also be applied for use in a micro pump, an ultrasonic motor, an acceleration sensor, a dual-axis scanner for a projector, an infusion pump, etc.

(Sixth Embodiment)

Figure 14:
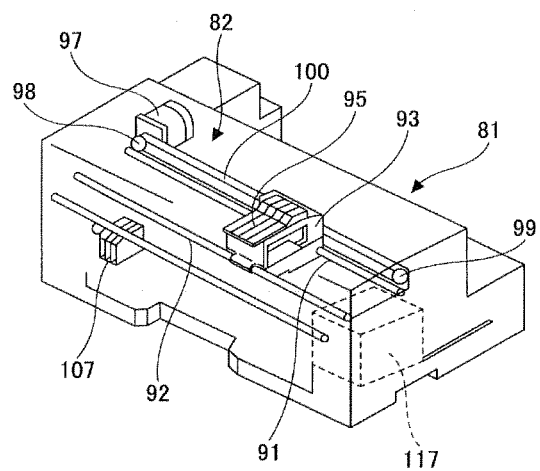
FIG. 14 is one schematic diagram for explaining an inkjet recording apparatus according to the present embodiment.
Figure 15:
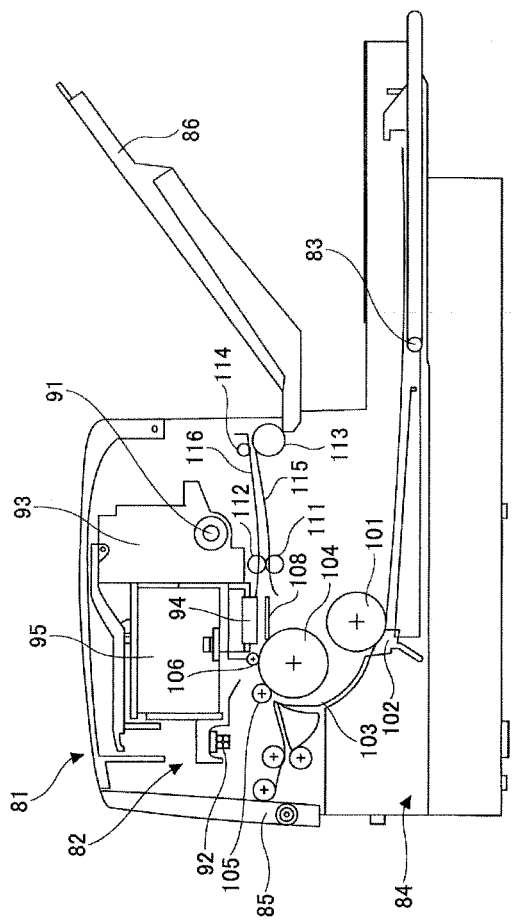
FIG. 15 is another schematic diagram for explaining the inkjet recording apparatus according to the present embodiment.

In a sixth embodiment, one example of an inkjet recording apparatus having mounted thereto a liquid droplet ejecting head according to a fifth embodiment is described with reference to FIGS. 14 and 15. FIG. 14 is one schematic diagram for explaining the inkjet recording apparatus according to the present embodiment, while FIG. 15 is another schematic diagram for explaining the inkjet recording apparatus according to the present embodiment.

The inkjet recording apparatus according to the present embodiment includes, within a recording apparatus body 81 thereof, a printing mechanical unit 82, etc., including a carriage 93 which is movable in a main scanning direction; an inkjet recording head 94, which is one embodiment of the present invention that is being mounted on the carriage 93; an ink cartridge 95 which supplies ink to the inkjet recording head 94, etc. At a lower part of the recording apparatus body 81, a paper feeding cassette 84 (or may also be a paper feeding tray) on which a large number of sheets 83 can be stacked may be mounted such that it can be pulled out or inserted. Moreover, a manual tray 85 for manually feeding the sheet 83 may be opened or put down. Taking in the sheet 83 fed from the paper-feeding cassette 84 or the manual tray 85, the print machinery unit 82 records required images, after which it conducts sheet discharging onto the paper-discharging tray 86 mounted on the back face side.

The print machinery unit 82 holds the carriage 93 with a primary guide rod 91 and a secondary guide rod 92, which are guide members laterally bridging between right and left side plates (not shown) such that the carriage 93 can freely slide in the main scanning direction. On the carriage 93, the inkjet recording head 94 according to the present invention that ejects ink droplets of respective colors of yellow (Y), cyan (C), magenta (M), and black (Bk) ink is mounted such that multiple ink ejecting ports (nozzles) are aligned in a direction which crosses the main scanning direction and an ink droplet ejecting direction faces downwards. Moreover, the carriage 93 has replaceably mounted each ink cartridge 95 for supplying ink of each color to the inkjet recording head 94.

The ink cartridge 95 has an atmospheric opening (not shown) which is communicatively connected to the atmosphere at an upper portion thereof, a supply port (not shown) which supplies ink to the inkjet recording head 94 at a lower portion thereof, and a porous body (not shown) which is filled with ink inside thereof. A capillary force of the porous body keeps ink supplied to the recording head 94 to a slightly negative pressure. Moreover, while heads of each color are used here as the inkjet recording head 94, it may be one head which has nozzles ejecting ink droplets of respective colors.

The carriage 93 has the downstream side in a sheet conveying direction thereof slidably fitted to the primary guide rod 91, and has the upstream side in the sheet conveying direction thereof slidably placed on the secondary guide rod 92. Then, in order to move and scan this carriage 93 in the main scanning direction, a timing belt 100 is stretched between a drive pulley 98 and a follower pulley 99 that are rotationally driven by the main scanning motor 97, and the carriage 93 is driven in both ways by rotation of the main scanning motor 97 in normal and reverse directions. The timing belt 100 is fixed to the carriage 93.

Moreover, the inkjet recording apparatus according to the present embodiment is provided with a friction pad 102, a paper feeding roller 101 which feeds the sheet 83 one by one from the paper-feeding cassette 84, a guide member 103 which guides the sheet 83, a conveying roller 104 which reverses the fed sheet 83 to convey the reversed sheet 83, a conveying roller 105 which is pushed against a peripheral face of the conveying roller 104, and a leading-end roller 106 which defines an angle of sending out the sheet 83 from the conveying roller 104. In this way, the sheet 83 which is set to the paper-supplying cassette 84 is conveyed to the lower side of the inkjet recording head 94. The conveying roller 104 is rotationally driven via a column of gears by a sub-scanning motor 107.

A print receiving member 109, which is a sheet guide member, guides, on the lower side of the recording head 94, the sheet 83 sent out from the conveying roller 104 in correspondence with a moving range of the carriage 93 in the main scanning direction. On the downstream side of the print receiving member 109 in the sheet conveying direction are provided a spur 112, and a conveying roller 111, which is rotationally driven to send out the sheet 83 in a discharging direction. Moreover, there are provided a spur 114, and a discharging roller 113, which sends out the sheet 83 to the sheet-discharging tray 86, and guide members 115 and 116, which form a paper-discharge path.

At the time of image recording, the recording head 94 is driven according to an image signal while moving the carriage 93 to eject ink onto sheets 83 at rest to record what amounts to one line, and the following line is recorded after the sheets 83 are conveyed for a predetermined amount. When a recording termination signal or a signal that a trailing edge of the sheet 83 has reached the recording area is received, the recording operation is terminated, so that the sheets 83 are discharged.

At a position which is off the recording area on the right end side in a moving direction of the carriage 93 is provided a recovery apparatus 117 for recovering an ejection failure of the head 94. The recovery apparatus 117 has a cap unit, a suction unit, and a cleaning unit. During the time of waiting for a print, the carriage 93 is moved to the recovery apparatus 117 side and has the head 94 capped with a capping unit, preventing an ejection failure due to drying of ink by maintaining an ejecting outlet in a wet state. Moreover, ink which is not related to recording is ejected at a time such as in the middle of recording, making the viscosity of ink at all of the ejecting outlets constant, and maintaining a stable ejection performance.

When the ejection failure occurs, etc., the ejecting outlet of the head 94 is sealed with a capping unit, and air bubbles, etc., as well as ink are suctioned from the ejecting outlet through a tube by the suction unit. Moreover, ink, dust, etc., which are adhered to the ejecting outlet face is removed by a cleaning unit so as to recover from the ejection failure. Moreover, the suctioned ink is discharged into a waste ink reservoir (not shown) installed at a lower portion of the body, and absorbed and kept by an ink absorber inside the waste ink reservoir.

In the inkjet recording apparatus according to the present embodiment, the liquid droplet ejecting head according to the fifth embodiment is mounted, so that there is no ink droplet ejection failure due to a failure in driving the vibrating plate, a stable ink droplet ejecting characteristic is obtained, so that image quality improves.

The present application is based on Japanese Priority Application No. 2012-179804 filed on Aug. 14, 2012, Japanese Priority Application No. 2013-030193 filed on Feb. 19, 2013, and Japanese Priority Application No. 2013-099983 filed on May 10, 2013, the entire contents of which are hereby incorporated by reference.

The invention claimed is:

1. An electro-mechanical transducer element, comprising:
a first electrode formed on a substrate;
an electro-mechanical transducer film formed on at least a part of the first electrode;
and a second electrode formed on at least a part of the electro-mechanical transducer film, wherein,
in at least one cross section of the electro-mechanical transducer film, a film thickness distribution shape is convex to the second electrode side, and
wherein the film thickness distribution shape is approximated by Equation 1: $y=-ax2+b$, wherein
x denotes a coordinate position in a direction perpendicular to a film thickness direction with a cross section center of the electro-mechanical transducer film being set to 0 in the cross section, and
y denotes a film thickness of the electro-mechanical transducer film at x.

2. The electro-mechanical element as claimed in claim 1, wherein
a in Equation 1 fulfills a relationship of $0.8\times((4Tm)/Wp2)<a<1.2\times((4Tm)/Wp2)$ using a film thickness $Tm(\mu m)$ of the electro-mechanical transducer film and a width $Wp(\mu m)$ in an x-axis direction of the electro-mechanical transducer film.

3. The electro-mechanical transducer element as claimed in claim 1, wherein,
b in Equation 1 fulfills a relationship of $0.8Tm<b<1.2Tm$.

4. The electro-mechanical transducer element as claimed in claim 1, wherein
a width Wp ($\mu m$) in an x-axis direction of the electro-mechanical transducer film;
a film thickness Tm ($\mu m$) of the electro-mechanical transducer film at the cross section center;
a width We ($\mu m$) in an x-axis direction of the second electrode; and
a film thickness Te of the electro-mechanical transducer film at an edge part of the second electrode in the cross section fulfill a relationship of $Te/Tm=-(We/Wp)2+1$.

5. The electro-mechanical transducer element as claimed in claim 4, wherein
a relationship of $0.4<-Tm\times(We/Wp)2+Tm$ is further fulfilled.

6. The electro-mechanical transducer element as claimed in claim 1, wherein the second electrode is located within a width of the electro-mechanical transducer film in the cross section.

7. The electro-mechanical transducer element as claimed in claim 1, wherein the electro-mechanical transducer film has an average composition in a film thickness direction differing between a center and an edge portion of the cross section.

8. A liquid droplet ejecting head including the electro-mechanical transducer element as claimed in claim 1.

9. An image forming apparatus including the liquid droplet ejecting head as claimed in claim 8.

10. An electro-mechanical transducer element, comprising:
a first electrode formed on a substrate;
an electro-mechanical transducer film formed on at least a part of the first electrode;
and a second electrode formed on at least a part of the electro-mechanical transducer film, wherein,
in at least one cross section of the electro-mechanical transducer film, a film thickness distribution shape is convex to the second electrode side, wherein the second electrode is located within a width of the electro-mechanical transducer film in the cross section, and wherein
the electro-mechanical transducer film contains $Pb(Zrm, Ti1-m)O3$, and wherein,
for an average composition, a Pb concentration decreases and a Zr concentration increases in a direction from the center to the edge portion, and wherein
$0<m<1$.

11. A liquid droplet ejecting head including the electro-mechanical transducer element as claimed in claim 10.

12. An image forming apparatus including the liquid droplet ejecting head as claimed in claim 11.

13. An electro-mechanical transducer element, comprising:
a first electrode formed on a substrate;
an electro-mechanical transducer film formed on at least a part of the first electrode;
and a second electrode formed on at least a part of the electro-mechanical transducer film, wherein,
in at least one cross section of the electro-mechanical transducer film, a film thickness distribution shape is convex to the second electrode side, and
wherein the electro-mechanical transducer film has an average composition in a film thickness direction differing between a center and an edge portion of the cross section, and wherein
the electro-mechanical transducer film contains $Pb(Zrn, Ti1-n)O3$, wherein
the electro-mechanical transducer film has a first layer and a second layer in a film thickness direction, wherein,
in the second layer, a Pb concentration is lower than that in the first layer and a Zr concentration is higher than that in the first layer, and wherein
$0<n<1$.

14. The electro-mechanical transducer element as claimed in claim 13, wherein the first layer and the second layer are mutually laminated in multiple numbers.

15. The electro-mechanical transducer element as claimed in claim 13, wherein
a ratio of a film thickness of the first layer relative to a sum of the film thickness of the first layer and the film thickness of the second layer is larger than the ratio at the edge portion.

16. A liquid droplet ejecting head including the electro-mechanical transducer element as claimed in claim 13.

17. An image forming apparatus including the liquid droplet ejecting head as claimed in claim 16.

* * * * *